(12) United States Patent
Sasaki et al.

(10) Patent No.: US 9,791,191 B2
(45) Date of Patent: Oct. 17, 2017

(54) TEMPERATURE CONTROL APPARATUS, PROCESSING APPARATUS, AND TEMPERATURE CONTROL METHOD

(71) Applicant: Tokyo Electron Limited, Tokyo (JP)

(72) Inventors: Yasuharu Sasaki, Miyagi (JP); Kazuyoshi Matsuzaki, Ibaraki (JP)

(73) Assignee: Tokyo Electron Limited, Tokyo (JP)

( * ) Notice: Subject to any disclaimer, the term of this patent is extended or adjusted under 35 U.S.C. 154(b) by 700 days.

(21) Appl. No.: 14/356,959

(22) PCT Filed: Nov. 9, 2012

(86) PCT No.: PCT/JP2012/079175
§ 371 (c)(1),
(2) Date: May 8, 2014

(87) PCT Pub. No.: WO2013/073482
PCT Pub. Date: May 23, 2013

(65) Prior Publication Data
US 2014/0345317 A1   Nov. 27, 2014

Related U.S. Application Data

(60) Provisional application No. 61/568,181, filed on Dec. 8, 2011.

(30) Foreign Application Priority Data

Nov. 14, 2011   (JP) .................................. 2011-249081

(51) Int. Cl.
*F25B 43/02*   (2006.01)
*H01L 21/67*   (2006.01)
(Continued)

(52) U.S. Cl.
CPC .............. *F25B 43/02* (2013.01); *F04C 18/00* (2013.01); *F04C 29/042* (2013.01);
(Continued)

(58) Field of Classification Search
CPC   F25B 2333/007; F25B 31/004; F04C 29/026; F04C 27/02; F04D 29/5826; F04D 29/5866; F05B 2260/205; F05B 2260/207
(Continued)

(56) References Cited

U.S. PATENT DOCUMENTS 5,697,771 A * 12/1997 Arndt .................... F04C 23/001
                                                                418/15
8,002,025 B2 * 8/2011 Audette ............. G01R 31/2874
                                                                165/104.19
2005/0155373 A1 * 7/2005 Hirooka .................. F25B 9/008
                                                                62/498

FOREIGN PATENT DOCUMENTS

JP          H01-231323         9/1989
JP          03-036472          2/1991
(Continued)

OTHER PUBLICATIONS

International Search Report mailed on Feb. 12, 2013.

*Primary Examiner* — Cassey D Bauer
(74) *Attorney, Agent, or Firm* — IPUSA, PLLC

(57) ABSTRACT

A temperature control apparatus (70) includes a heat exchanger (71) configured to exchange heat with the surroundings using a phase change of a refrigerant, a rotary pump (73) configured to receive the refrigerant from the heat exchanger (71) and fuse the refrigerant with oil contained inside the rotary pump, and an oil water separator (74) configured to receive the refrigerant fused with the oil from the rotary pump (73) and separate the refrigerant from the oil. The temperature control apparatus further includes a refrigeration cycle that implements a cooling function by (Continued)

circulating the refrigerant separated from the oil back to the heat exchanger (71).

7 Claims, 12 Drawing Sheets

(51) Int. Cl.
   *H01J 37/32* (2006.01)
   *F25B 31/00* (2006.01)
   *F04C 29/04* (2006.01)
   *F04C 18/00* (2006.01)
   *F25B 1/053* (2006.01)
   *F25B 13/00* (2006.01)
   *F25B 49/02* (2006.01)

(52) U.S. Cl.
   CPC ...... *F25B 31/004* (2013.01); *H01J 37/32724* (2013.01); *H01L 21/67017* (2013.01); *H01L 21/67109* (2013.01); *F25B 1/053* (2013.01); *F25B 13/00* (2013.01); *F25B 49/02* (2013.01); *F25B 2600/21* (2013.01)

(58) Field of Classification Search
   USPC .......................... 62/268, 100, 169, 296–270; 415/176–178
   See application file for complete search history.

(56) References Cited

FOREIGN PATENT DOCUMENTS

| | | |
|---|---|---|
| JP | 2007-116098 | 5/2007 |
| JP | 2008-157583 | 7/2008 |
| JP | 2010-129766 | 6/2010 |
| JP | 2011-077452 | 4/2011 |
| WO | WO 2004/025199 | 3/2004 |

* cited by examiner

TEMPERATURE CONTROL APPARATUS, PROCESSING APPARATUS, AND TEMPERATURE CONTROL METHOD

CROSS-REFERENCE TO RELATED APPLICATIONS

The present application is a National Stage of International Application No. PCT/JP2012/079175 filed on Nov. 9, 2012, claiming priority based on Japanese Patent Application No. 2011-249081 filed on Nov. 14, 2011, and U.S. Provisional Application No. 61/568,181 filed on Dec. 8, 2011, the entire contents of which are hereby incorporated by reference.

TECHNICAL FIELD

The present invention relates to a temperature control apparatus, a processing apparatus, and a temperature control method.

BACKGROUND ART

Temperature control apparatuses are known that circulate a refrigerant to cool or heat an object using vaporization heat absorbed from the surroundings and condensation heat released to the surroundings as a result of a phase change in the refrigerant. For example, Patent Document 1 discloses a temperature control apparatus that uses the vaporization heat of a refrigerant to cool an electrostatic chuck arranged within a plasma reactor.

PRIOR ART DOCUMENTS

Patent Documents

Patent Document 1: Japanese Laid-Open Patent Publication No. 2007-116098

SUMMARY OF THE INVENTION

Problem to be Solved by the Invention

However, a gas that destroys the ozone layer is used in the refrigerant circulated within the temperature control apparatus disclosed in Patent Document 1. Hydrocarbon-based gases are examples of ozone depleting substances that destroy the ozone layer, and waste refrigerant containing such substance is harmful to the environment in that it causes global warming.

The refrigeration cycle of the temperature control apparatus disclosed in Patent Document 1 includes a heat exchanger, a compressor, a condenser, and an expansion valve. In the structure disclosed in Patent Document 1, a refrigerant, which is inherently gaseous, is liquefied and is converted back to gas within a heat exchanger arranged inside a mounting table. Accordingly, the phase change between gas and liquid has to be controlled under high pressure. Thus, for example, in the refrigeration cycle disclosed in Patent Document 1, the interior of a circulation cycle has to be designed to withstand a high pressure of approximately 15-20 atm. Accordingly, in Patent Document 1, a highly durable pressure chamber has to be provided by arranging a thick wall around the heat exchanger, for example, so that the heat exchanger may be prevented from deforming even under a high pressure. As a result, the heat capacity of the heat exchanger is increased to thereby degrade temperature responsiveness.

In light of the above, one aspect of the present invention relates to providing a temperature control apparatus, a processing apparatus, and a temperature control method that enable temperature control without using an ozone depleting substance in the refrigerant.

Means for Solving the Problem

According to one embodiment of the present invention, a temperature control apparatus is provided that includes a heat exchanger configured to exchange heat using a phase change of a refrigerant, a rotary pump configured to receive the refrigerant from the heat exchanger and fuse the refrigerant with oil contained inside the rotary pump, and an oil refrigerant separator configured to receive the refrigerant fused with the oil from the rotary pump and separate the refrigerant from the oil. The temperature control apparatus further includes a refrigeration cycle that implements a cooling function by circulating the refrigerant separated from the oil back to the heat exchanger.

According to another embodiment of the present invention, a plasma processing apparatus is provided that includes a processing chamber in which a plasma process is performed; a gas supply source configured to supply gas to the processing chamber; a plasma source configured to supply power for plasma generation and generate plasma from gas within the processing chamber; a heat exchanger that is arranged in at least one of the processing chamber, a mounting table arranged in the processing chamber, an upper electrode arranged in the processing chamber, and a deposition shield arranged in the processing chamber, and is configured to exchange heat using a phase change of a refrigerant; a rotary pump configured to receive the refrigerant from the heat exchanger and fuse the refrigerant with oil contained inside the rotary pump; and an oil refrigerant separator configured to receive the refrigerant fused with the oil from the rotary pump and separate the refrigerant from the oil. The plasma processing apparatus further includes a refrigeration cycle that implements a cooling function by circulating the refrigerant separated from the oil back to the heat exchanger.

According to another embodiment of the present invention, a processing apparatus is provided that includes a temperature control apparatus that is mounted to a temperature control object and is configured to control a temperature of the temperature control object. The temperature control apparatus includes a heat exchanger configured to exchange heat using a phase change of a refrigerant; a rotary pump configured to receive the refrigerant from the heat exchanger and fuse the refrigerant with oil contained inside the rotary pump; and an oil refrigerant separator configured to receive the refrigerant fused with the oil from the rotary pump and separate the refrigerant from the oil. The temperature control apparatus further includes a refrigeration cycle that implements a cooling function by circulating the refrigerant separated from the oil back to the heat exchanger.

According to another embodiment of the present invention, a temperature control method is provided that is implemented by a temperature control apparatus including a heat exchanger configured to exchange heat using a phase change of a refrigerant, a rotary pump configured to receive the refrigerant from the heat exchanger and fuse the refrigerant with oil contained inside the rotary pump, and an oil refrigerant separator configured to receive the refrigerant fused with the oil from the rotary pump and separate the refrigerant from the oil. The temperature control method includes the steps of circulating the refrigerant separated from the oil back to the heat exchanger; and adjusting at least one of a rotation speed of a rotor of the rotary pump, a position of a valve arranged at a connecting portion of the rotary pump and the heat exchanger, and a position of an airflow adjustment valve arranged at a connecting portion of the oil refrigerant separator and the heat exchanger.

Advantageous Effect of the Invention

According to an aspect of the present invention, a temperature control apparatus, a processing apparatus, and a temperature control method may be provided that enable temperature control without using an ozone depleting substance in the refrigerant.

EMBODIMENTS FOR IMPLEMENTING THE INVENTION

Figure 1:
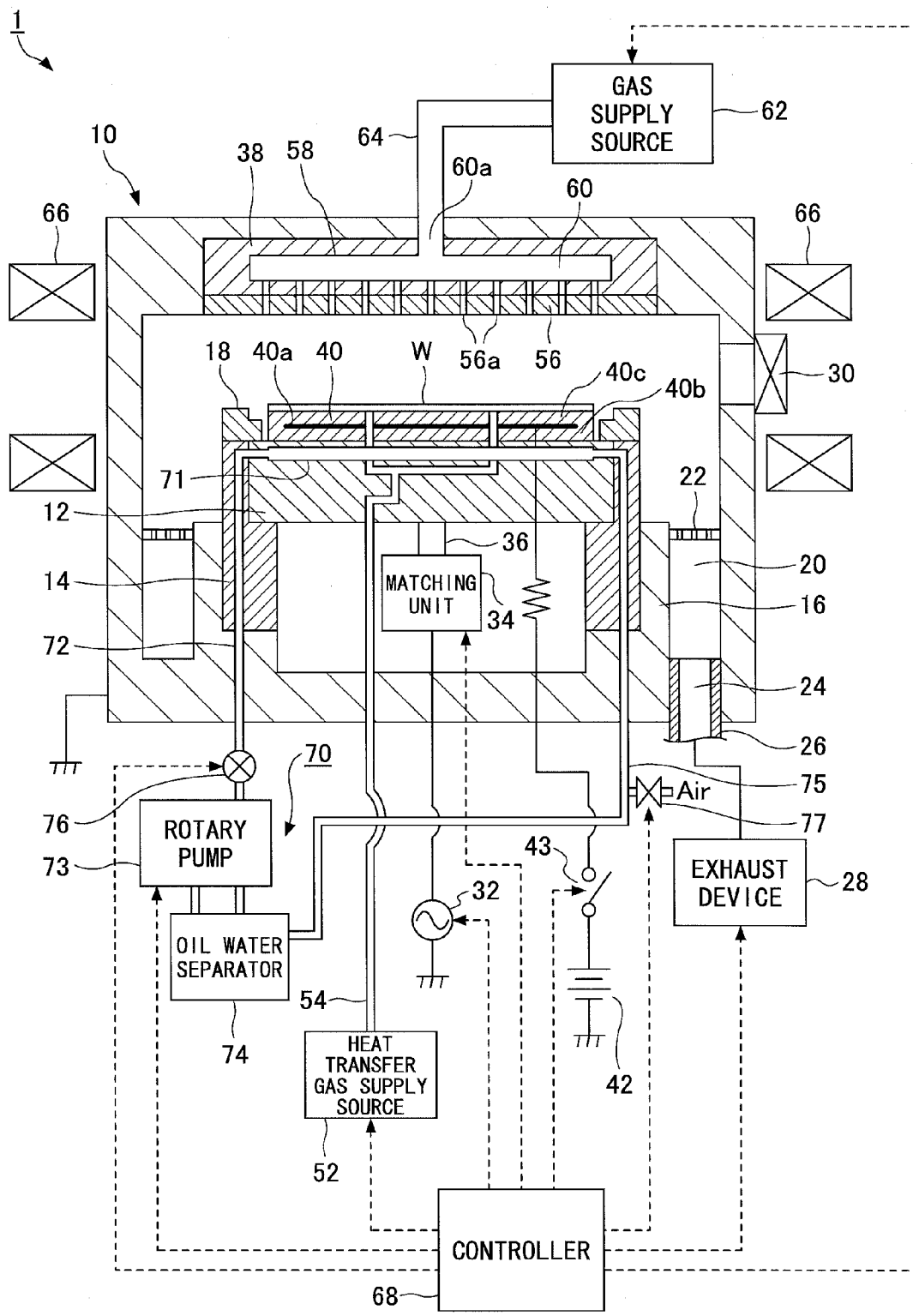
FIG. 1 illustrates an overall configuration of a plasma processing apparatus that uses a temperature control apparatus according to a first embodiment of the present invention.

In the following, embodiments of the present invention are described with reference to the accompanying drawings. Note that elements having substantially the same functions or features may be given the same reference numerals and overlapping descriptions thereof may be omitted.

<Introduction>

In an ordinary refrigeration cycle, an ozone depleting gas such as hydrocarbon-based gas is used in a refrigerant that is circulated within a temperature control apparatus. Refrigerant waste containing such a substance is harmful to the environment in that it causes global warming. In view of the above, embodiments described below relate to a temperature control apparatus that is capable of performing temperature control without using such ozone depleting substance. In the embodiments described below, water is used as the refrigerant and vaporization heat of water is used for cooling. In this way, a temperature control apparatus may be provided that uses vaporization heat absorbed from the surroundings or condensation heat released to the surroundings as a result of a phase change in water to cool or heat an object.

Also, in the temperature control apparatus according to embodiments of the present invention, the interior of a heat exchanger does not have to be set to a high pressure. In fact, the pressure within the heat exchanger has to be reduced in order to enable vaporization of a liquid under a temperature of less than 100° C. Thus, in a case where the temperature control apparatus according to an embodiment of the present invention is implemented in a plasma processing apparatus, a predetermined portion of the temperature control apparatus may be easily controlled to a reduced-pressure in view of the fact that controlling the pressure of a chamber to a reduced-pressure atmosphere is normally performed in the plasma processing apparatus. Also, in embodiments of the present invention, a chamber having a small heat capacity may be used in the heat exchanger, and in this way, temperature responsiveness may be improved and energy resources may be conserved.

As described below, in the temperature control apparatus according to embodiments of the present invention, accurate temperature control may be performed without using an ozone depleting substance in the refrigerant.

First Embodiment

[Overall Configuration of Plasma Processing Apparatus using Temperature Control Apparatus]

First, an overall configuration of a plasma processing apparatus that uses a temperature control apparatus according to a first embodiment of the present invention is described with reference to FIG. 1.

The plasma processing apparatus 1 illustrated in FIG. 1 is configured as a RIE (Reactive Ion Etching) plasma processing apparatus. The plasma processing apparatus 1 includes a cylindrical chamber (processing chamber 10) made of a metal such as aluminum or stainless steel, for example. The processing chamber 10 is grounded.

A mounting table 12 configured to hold a semiconductor wafer W (hereinafter, simply referred to as a "wafer W") thereon as a workpiece is arranged within the processing chamber 10. In such a state, microfabrication processes such as etching may be performed on the wafer W using the action of plasma. The mounting table 12 may be made of aluminum, for example, and is supported on a cylindrical support 16 via an insulating cylindrical holder 14. The cylindrical support 16 extends vertically upward from a bottom of the processing chamber 10. A focus ring 18 that may be made of quartz, for example, is disposed on a top surface of the cylindrical holder 14 to surround a top surface edge of the mounting table 12.

An exhaust path 20 is formed between a sidewall of the processing chamber 10 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust line 26. The exhaust device 28 includes a vacuum pump (not shown) and is configured to depressurize a processing space within the processing chamber 10 to a predetermined vacuum level. A gate valve 30 configured to open/close an entry/exit port for the wafer W is provided at the sidewall of the processing chamber 10.

A high frequency power supply 32 for plasma generation is electrically connected to the mounting table 12 via a matching unit 34 and a power feed rod 36. The high frequency power supply 32 is configured to apply a high frequency power of 60 MHz, for example, to the mounting table 12. In this way, the mounting table 12 also acts as a lower electrode. Further, a shower head 38, which is described below, is provided at a ceiling portion of the processing chamber 10. The shower head 38 acts as an upper electrode of a ground potential. In this way, a high frequency voltage from the high frequency power supply 32 is capacitatively applied between the mounting table 12 and the shower head 38. The high frequency power supply 32 is an example of a plasma source that supplies power for plasma generation to the processing chamber 10 and generates plasma from gas within the processing chamber 10.

An electrostatic chuck 40 configured to hold the wafer W by an electrostatic attractive force is provided on the top surface of the mounting table 12. The electrostatic chuck 40 includes an electrode 40a that is made of a conductive film and is arranged between a pair of insulating films 40b and 40c. A DC power supply 42 is electrically connected to the electrode 40a via a switch 43. The electrostatic chuck 40 electrostatically attracts and holds the wafer W by a Coulomb force generated by a DC voltage from the DC power supply 42.

The electrostatic chuck 40 is cooled by a temperature control unit 70. The temperature control unit 70 includes a heat exchanger 71, a rotary pump 73, and an oil water separator 74. The heat exchanger 71 is arranged inside the mounting table 12. The heat exchanger 71 is connected to the rotary pump 73 and the oil water separator 74 via a suction pipe 72. The heat exchanger 71 is also connected to the oil water separator 74 via a water pipe 75. A valve 76 is arranged at the suction pipe 72 between the heat exchanger 71 and the rotary pump 73. An airflow adjustment valve 77 is arranged at the water pipe 75 between the heat exchanger 71 and the oil water separator 74. The mounting table 12 may be cooled by supplying a refrigerant to the temperature control apparatus 70 having the above configuration. Note that detailed functions and operations of the temperature control apparatus 70 are described below.

A heat transfer gas supply source 52 is configured to supply a heat transfer gas such as He gas between a top surface of the electrostatic chuck 40 and a rear surface of the wafer W through a gas supply line 54. The shower head 38 disposed at the ceiling portion of the processing chamber 10 includes an electrode plate 56 having multiple gas holes 56a and an electrode supporting body 58 configured to detachably hold the electrode plate 56. A buffer chamber 60 is formed within the electrode supporting body 58. A gas inlet 60a of the buffer chamber 60 is connected to a gas supply line 64, which is connected to a gas supply source 62. In this way, desired gas may be supplied to the processing chamber 10 from the gas supply source 62.

A magnet 66 is arranged to extend annularly or concentrically around the processing chamber 10. An RF electric field is formed in a plasma generating space between the shower head 38 and the mounting table 12 within the processing chamber 10 along a vertical direction by the high frequency power supply 32. Due to a high frequency discharge, high-density plasma may be generated around the surface of the mounting table 12.

A controller 68 is configured to control the individual components of the plasma processing apparatus 1 such as the exhaust device 28, the high frequency power supply 32, a switch 43 for the electrostatic chuck 40, the matching unit 34, the heat transfer gas supply source 52, the gas supply source 62, and the airflow adjustment valve 77. The controller 68 may also be connected to a host computer (not shown), for example. The controller 80 includes a CPU (Central Processing Unit), a ROM (Read Only Memory) and a RAM (Random Access Memory), which are not shown. The CPU executes a process according to a recipe stored in a storage unit. In this way, an etching process may be controlled by the CPU. The storage unit may be configured as the ROM or the RAM using a semiconductor memory, a magnetic disk, or an optical disk, for example. The recipe may be stored in a storage medium and loaded in the storage unit via a driver (not shown), for example. Alternatively, the recipes may be downloaded from a network (not shown) and stored in the storage unit. Also, in some embodiments, a DSP (Digital Signal Processor) may be used instead of the CPU to implement the above-described functions of various components of the plasma processing apparatus 1. Note that functions of the controller 68 may be implemented by software or hardware.

When performing an etching process using the plasma processing apparatus 1 having the above-described configuration, first, the gate valve 30 is opened, and the wafer W is loaded into the processing chamber 10 and placed on the electrostatic chuck 40. Then, an etching gas is introduced into the processing chamber 10 from the gas supply source 62 at a predetermined flow rate and a predetermined flow rate ratio, and the internal pressure of the processing chamber 10 is reduced to a predetermined pressure by the exhaust device 28. Further, a high frequency power of a certain power level is applied to the mounting table 12 from the high frequency power supply 32. Also, a DC voltage from the DC power supply 42 is applied to the electrode 40a of the electrostatic chuck 40 so that the wafer W may be fixed to the electrostatic chuck 40. The etching gas sprayed into the processing chamber 10 from the shower head 38 is decomposed by the high frequency power from the high frequency power supply 32, and as a result, plasma is generated within a plasma generating space between the upper electrode (shower head 38) and the lower electrode (mounting table 12). A main surface of the wafer W is etched by radicals and ions contained in the generated plasma.

Temperature control of the wafer W is important in performing precise and accurate microfabrication such as etching on the wafer W. Accordingly, as illustrated in FIG. 1, the heat exchanger 71 is arranged inside the mounting table 12, which is arranged near the electrostatic chuck 40, and the heat exchanger 71 is configured to cool the electrostatic chuck 40 and the mounting table 12. In the following, configurations and operations of the temperature control apparatus 70 including the heat exchanger 71 are described.

[Temperature Control Apparatus]

Figure 2:
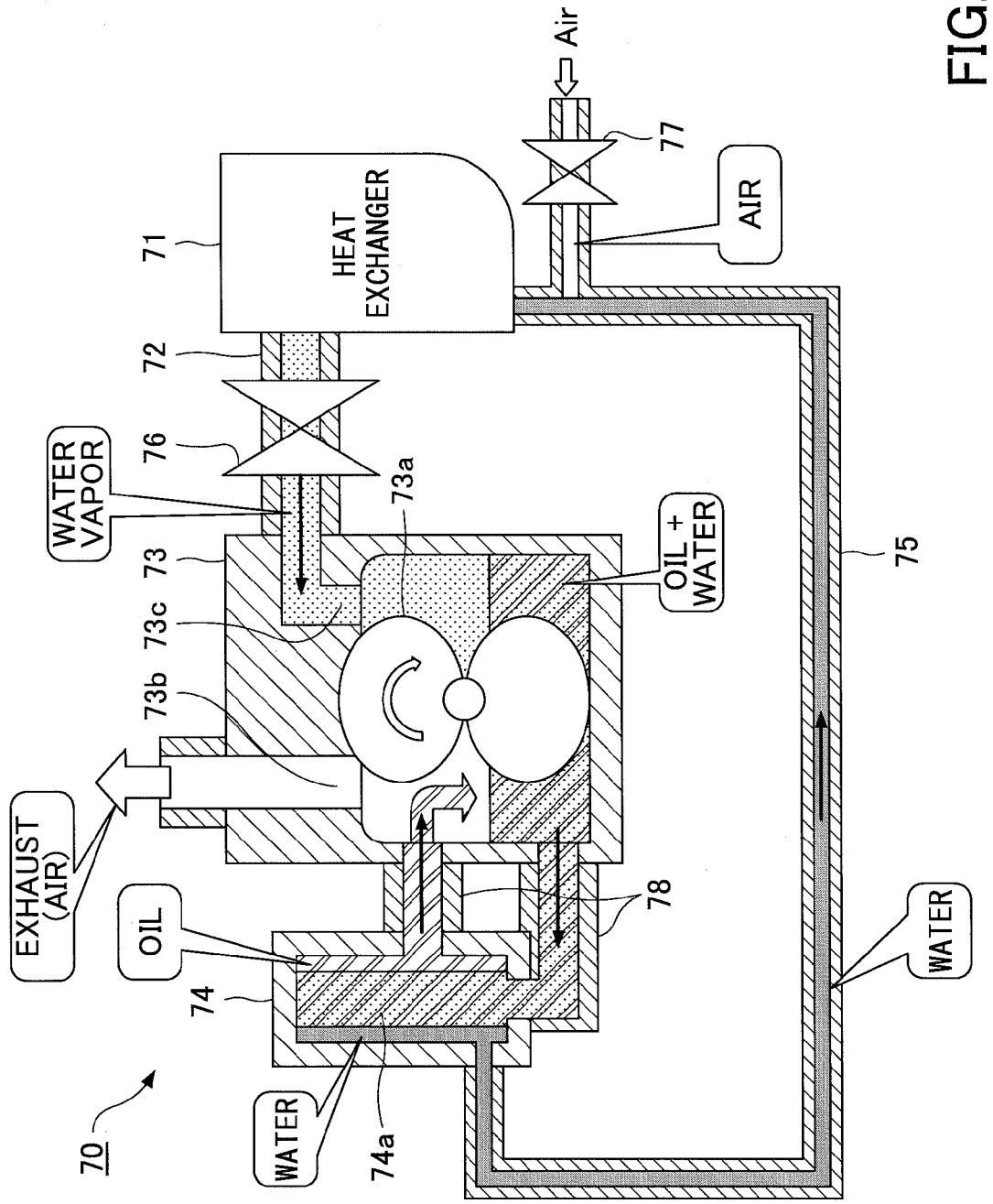
FIG. 2 illustrates an overall configuration of the temperature control apparatus according to the first embodiment.

FIG. 2 illustrates an overall configuration of the temperature control apparatus 70. The temperature control apparatus 70 includes the heat exchanger 71, the rotary pump 73, and the oil water separator 74. The heat exchanger 71 and the rotary pump 73 are interconnected via the suction pipe 72. The valve 76 is arranged at the suction pipe 72. The heat exchanger 71 and the oil water separator 74 are interconnected via the water pipe 75. The airflow adjustment valve 77 is arranged at a pipe branching out from the water pipe 75. The airflow adjustment valve 77 is configured to adjust the amount of air to be introduced into water that is circulated within the water pipe 51. The rotary pump 73 and the oil water separator 74 are interconnected by reciprocating pipes 78 for circulating oil. By circulating water through the temperature control apparatus 70 that is arranged into a tubular structure as described above, the temperature control apparatus 70 may function as a refrigeration cycle for cooling the surroundings of the heat exchanger 71.

(Heat Exchanger)

Figure 3:
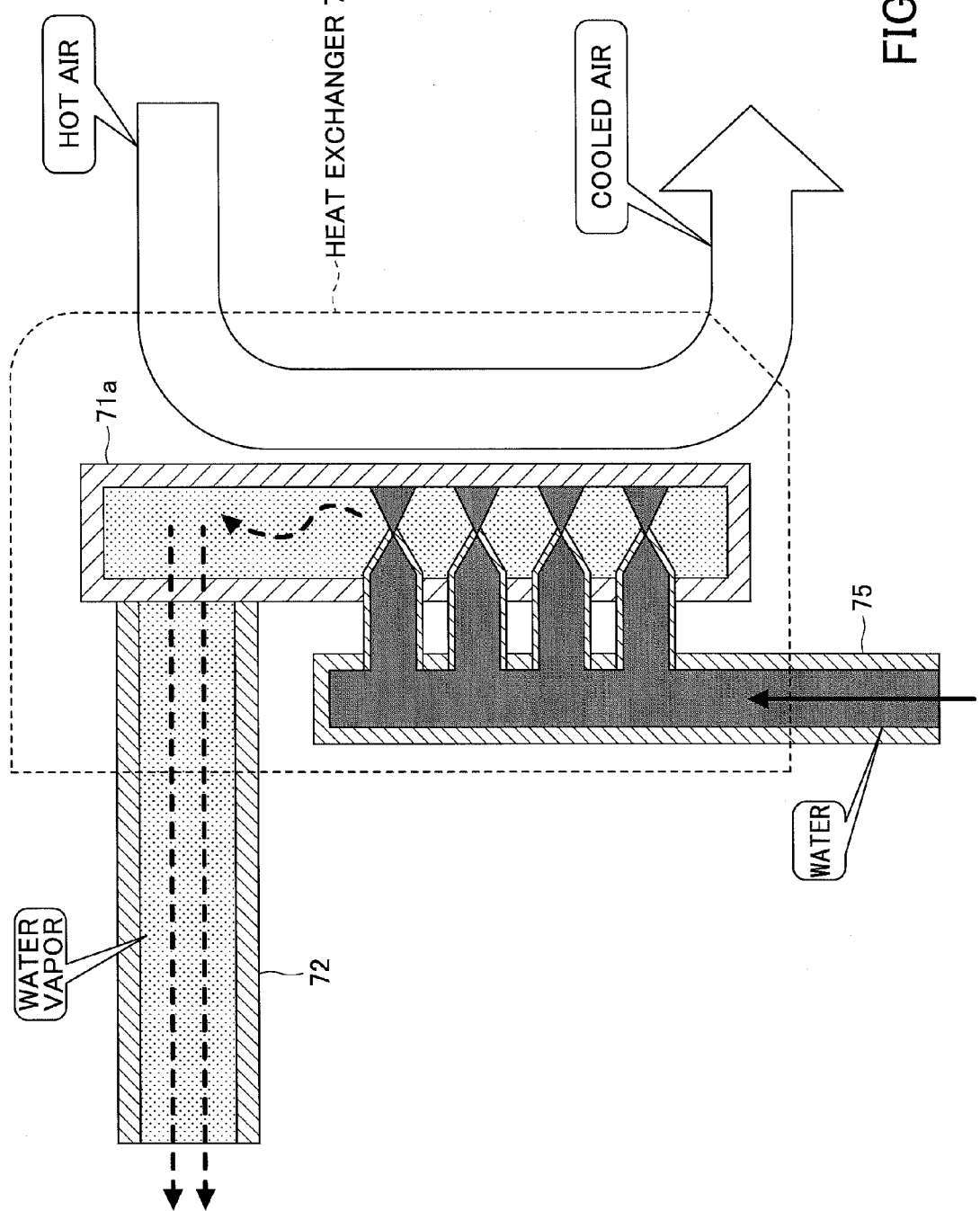
FIG. 3 illustrates a heat exchanger of the temperature control apparatus according to the first embodiment.

The heat exchanger 71 is configured to exchange heat with its surrounding in response to a phase change in water. The heat exchange function of the heat exchanger 71 is described below with reference to FIG. 3. Like a typical refrigeration cycle, the heat exchanger 71 includes an evaporation chamber 71a as an indoor unit. The heat exchanger 71 has functions of cooling and converting external hot air into cool air, and removing heat from an object located near the heat exchanger 71 to lower the temperature of the object, for example. Water circulated within the water pipe 75 is introduced into the evaporation chamber 71a. The heat exchanger 71 vaporizes the water inside the evaporation chamber 71a, which his controlled to a reduced-pressure atmosphere, to generate water vapor. The generated water vapor is discharged toward the suction pipe 72. In this way, the heat exchanger 71 cools the surroundings of the heat exchanger 71 using vaporization heat absorbed from the exterior when the phase of water changes from liquid to gas (water vapor).

To cause evaporation of water at a temperature below 100° C. corresponding to the boiling point of water under normal pressure, the interior of the evaporation chamber 71a has to be controlled to a reduced-pressure atmosphere (vacuum). In the present embodiment and in the second embodiment described below, the rotary pump 73 (oil pump) as illustrated in FIG. 2 is used to control the interior of the evaporation chamber 71a to a reduced-pressure atmosphere. In the evaporation chamber 71a that is controlled to a reduced-pressure atmosphere by operating the rotary pump 73, water is turned into water vapor (reduced pressure water vapor) and is diffused within the evaporation chamber 71a.

(Rotary Pump)

As illustrated in FIG. 2, the rotary pump 73 includes a rotor 73a. The rotor 73a is rotated by the power of a motor (not shown). In FIG. 2, an inlet 73c for introducing water vapor is arranged at an upper right side portion of the rotary pump 73, and an exhaust port 73b for discharging air is arranged at an upper left side portion of the rotary pump 73. In the rotary pump 73, the rotor 73a is rotated to discharge air outside the apparatus via the exhaust port 73b. An oil layer is provided at a bottom portion within the rotary pump 73. The oil layer acts as a sealing material for separating the internal space of the rotary pump 73 into a right side space and a left side space. In this way, the internal space of the rotary pump 73 is divided into two (right chamber and left chamber in FIG. 2). The rotary pump 73 controls the right chamber to be in a reduced-pressure state by rotating the rotor 73a clockwise as illustrated in FIG. 2. In this way, the right chamber may constitute a reduced-pressure space and the left chamber may constitute an atmospheric pressure space. The reduced-pressure space of the rotary pump 73 is connected to the evaporation chamber 71a. By arranging the right side space of the rotary pump 73 to constitute a reduced-pressure space, the internal space of the evaporation chamber 71a may be controlled to a reduced-pressure space.

The rotary pump 73 introduces the reduced-pressure water vapor generated within the evaporation chamber 71a into its interior, and rotates the rotor 73a to compress the water vapor and fuse the water vapor with the oil inside the rotary pump 73. In the illustrated example of FIG. 2, the reduced-pressure water vapor is represented by a water layer that is separate from the oil layer within the rotary pump 73. The water vapor introduced into the rotary pump 73 dissolves into oil. The water vapor that dissolves into the oil may be handled as liquid water. Accordingly, the mixture of water dissolved into oil is passed through a filter 74a of the oil water separator 74 and the water is separated from the oil by the oil water separator 74. In this way, the refrigerant that has been gasified into water vapor at the heat exchanger 71 may be converted back to liquid water using the rotary pump 73 and the oil water separator 74.

(Oil Water Separator)

The water that has been separated from the oil by the oil water separator 74 is returned to the water pipe 75 to be reused as the refrigerant. The water is thus recirculated through the water pipe 75, the heat exchanger 71, the suction pipe 72, the rotary pump 73, and the oil water separator 74. The circulated water undergoes a phase change from water to water vapor once again at the heat exchanger 71. In this way, an object near the heat exchanger 71 may be cooled, for example.

The oil separated from the water by the oil water separator 74 is recovered by the rotary pump 73 via the pipe 78. Note that the oil water separator 74 is an example of an oil refrigerant separator that is configured to receive the refrigerant fused with oil from the rotary pump 73 and separate the refrigerant from the oil. Also, note that the refrigerant is not limited to water, but may be some other type of liquid that can be separated from oil. For example, alcohol or ammonium may be used as the refrigerant instead of water. However, because the latent heat of water is greater than that of the above exemplary alternative refrigerants, a greater cooling effect may be achieved by using water as the refrigerant.

(Refrigeration Cycle)

The circulation cycle as described above may act as a refrigeration cycle. That is, water corresponding to the refrigerant circulates through the heat exchanger 71 (evaporation chamber 71a), the suction pipe 72, the rotary pump 73, the oil water separator 74, the water pipe 75, and back to the heat exchanger 71 (evaporation chamber 71a). By reducing the pressure within the evaporation chamber 71a, water may evaporate even under a temperature below 100° C. (e.g. room temperature), for example. Accordingly, a phase change from water to water vapor may be prompted at the heat exchanger 71 under a temperature of 50° C., for example. In the temperature control apparatus 70 according to the present embodiment, the surroundings of the heat exchanger 71 may be cooled by removing (absorbing) the vaporization heat from the surroundings when the phase change from water to vapor occurs.

[Temperature Control Method]

In the following, a temperature control method for controlling the temperature of the electrostatic chuck 40 (wafer W) using the temperature control apparatus 70 according to the present embodiment is described. In the temperature control apparatus 70 according to the present embodiment, the temperature of the electrostatic chuck 40 may be controlled by controlling the flow rate of water being circulated and the pressure within the evaporation chamber 71a. Such control operations may be implemented based on a relevant command from the controller 68.

The flow rate of water determines the cooling capacity of the refrigeration cycle. That is, the amount of calories that may be used for cooling is proportional to the volume of water that is flown per time unit. Thus, the flow rate of water may be controlled based on the heat load (kW) that has to be cooled. Accordingly, in the present embodiment, the controller 68 controls the flow rate of water according to an expected heat input from plasma. On the other hand, the pressure within the evaporation chamber 71a may be controlled based on the desired temperature (° C.) of the heat exchanger 71. For example, in a case where a cooling capacity for cooling a heat load of 1 kW is desired, the flow rate of water may be unambiguously determined. However, the pressure level to which the evaporation chamber 71a is to be adjusted may vary depending on whether the desired temperature of the heat exchanger 71 is 5° C. or 50° C., for example. The controller 68 controls the pressure within the evaporation chamber 71a such that the pressure may be lower in the case where the desired temperature of the heat exchanger 71 is 5° C. compared to the case where the desired temperature of the heat exchanger 71 is 50° C.

Note that the controller 68 implements at least one of the following control methods (1)-(3) upon controlling the pressure within the evaporation chamber 71a.

(1) Change capacity of rotary pump 73 itself.
(2) Change amount of air introduced into rotary pump 73.
(3) Change amount of air introduced into heat exchanger 71.

In the case of implementing control method (1) that involves changing the capacity of the rotary pump 73 itself, the power from the motor (not shown) is adjusted to change the rotation speed of the rotor 73a. Also, in some embodiments, the pressure within the evaporation chamber 71a may be controlled by increasing or decreasing the number of rotary pumps that are operated in a case where a plurality of rotary pumps are arranged in parallel. In the case of implementing control method (2) that involves changing the amount of air introduced into the rotary pump 73, the position of the valve 76 may be adjusted to change the conductance of the suction pipe 72. In the case of implementing control method (3) that involves changing the amount of air introduced into heat exchanger 71, the position of the airflow adjustment valve 77 may be adjusted to change the amount of external air introduced into the heat exchanger 71.

As described above, the controller 68 is configured to control the temperature control operations of the temperature control apparatus 70 by controlling at least one of the rotation speed of the rotor 73a, the position of the valve 76, and the position of the airflow adjustment valve 77. The motor driving the rotor 73a, the valve 76, and the airflow adjustment valve 77 are connected to the controller 68 and are configured to operate based on a command from the controller 68. A temperature sensor (not shown) is attached to the heat exchanger 71, and the controller 68 feedback controls the detection result of the temperature sensor to adjust the pressure within the evaporator 71a.

[Temperature Control Apparatus Operations]

Figure 4:
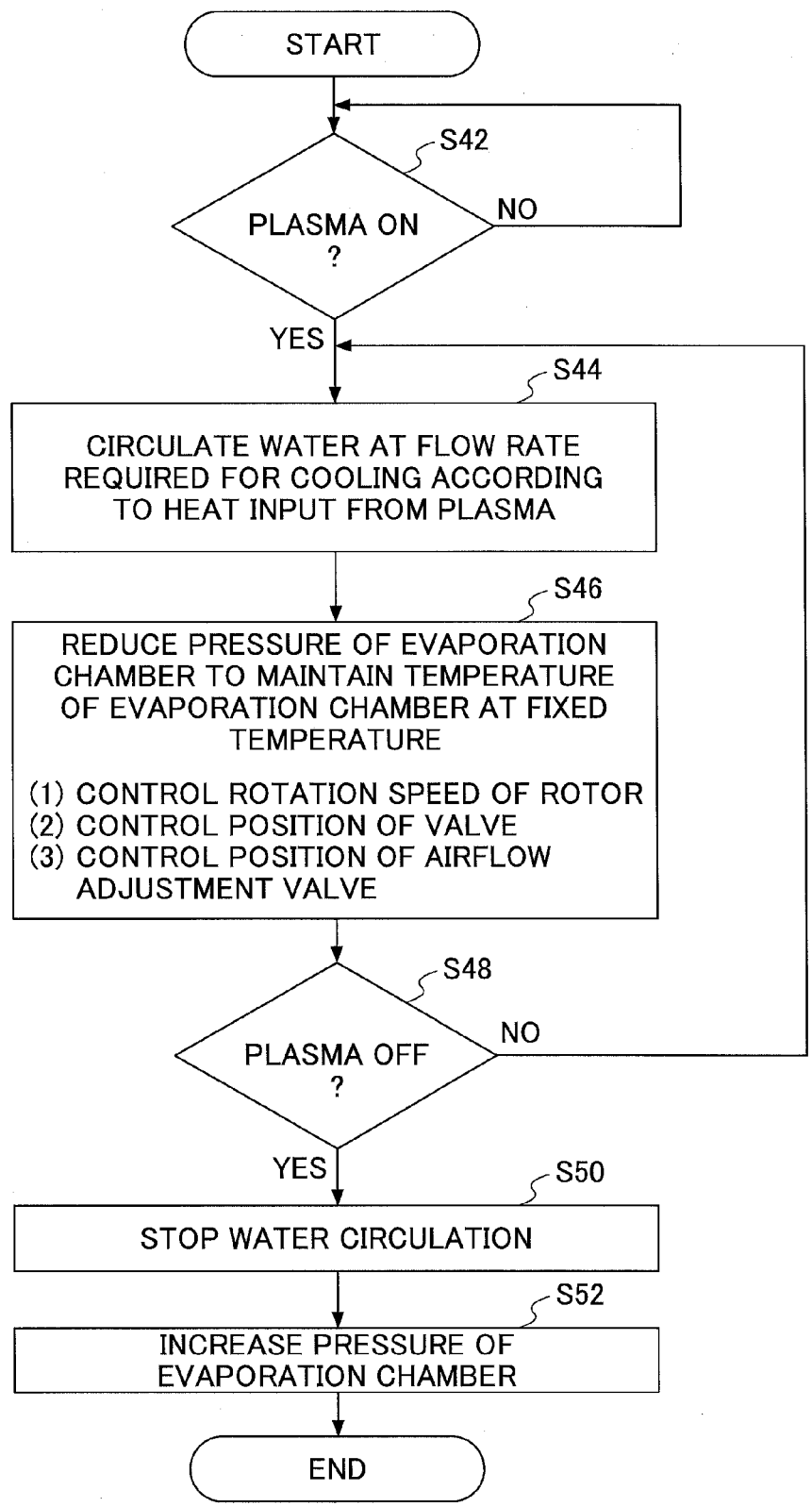
FIG. 4 is a flowchart illustrating operations of the temperature control apparatus according to the first embodiment.

In the following, operations of the temperature control apparatus 70 according to the present embodiment are described with reference to the flowchart of FIG. 4 illustrating a temperature control process.

When the temperature control process of FIG. 4 is started, the controller 68 determines whether plasma is turned ON (step S42). The controller 68 may determine that the plasma is turned ON when gas is supplied to the processing chamber 10 and a high frequency power is applied to the mounting table 12, for example. Alternatively, the controller 68 may monitor the temperature of the mounting table 12 using the temperature sensor and determine that the plasma is turned ON based on the detected temperature change of the mounting table 12, for example. Upon determining that the plasma is turned ON, the controller 68 starts operation of the rotary pump 73 and circulates water within the temperature control apparatus 70 at a predetermined flow rate required for cooling according to the heat input from plasma (step S44).

Figure 5:
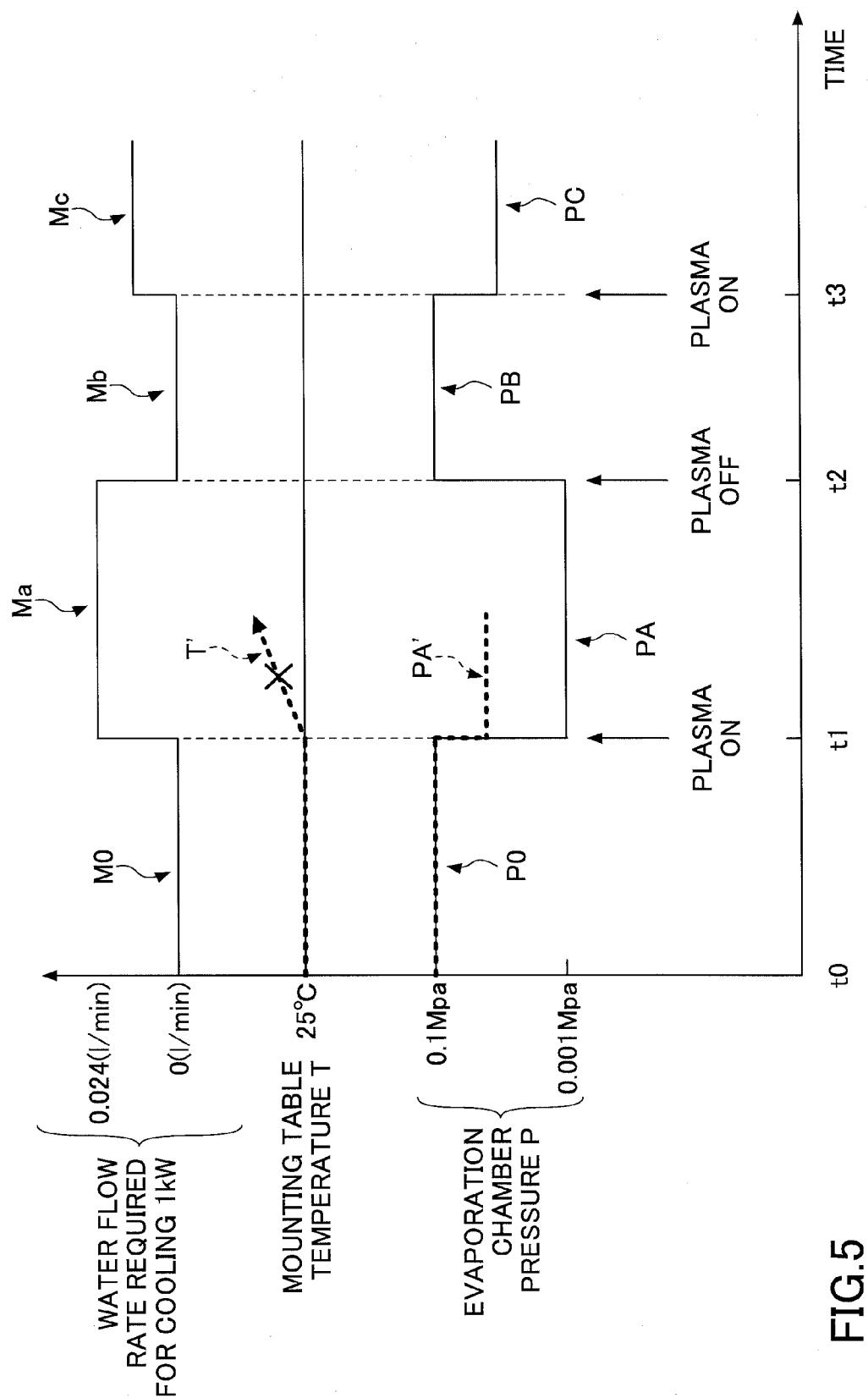
FIG. 5 is a time chart illustrating operations of the temperature control apparatus according to the first embodiment.

For example, as illustrated in the time chart of FIG. 5, in a case where the temperature T of the mounting table 12 is desirably controlled to 25° C., and the temperature of the mounting table 12 before starting the present process is 25° C., the temperature control apparatus 70 does not have to perform any temperature control operation. Accordingly, during the period from time t0 to time t1 before plasma is turned ON, the controller 68 does not circulate water within the temperature control apparatus 70. Thus, the flow rate M0 of water circulated during this period is 0 (zero).

During a period in which plasma is generated through plasma ignition, i.e., while plasma is turned ON, unless some cooling measure is implemented, the temperature of the mounting table 12 will be raised by the heat input from plasma and the temperature of the wafer W will be changed to thereby cause adverse effects on the etching process. Accordingly, once the plasma is turned ON, the refrigeration cycle has to be promptly driven. For example, during the period from time t1 to time t2 in which plasma is turned ON, if the heat input from plasma is 1 kW, a cooling capacity for cooling a heat load of 1 kW is required. In this case, the controller 68 starts circulating water at the flow rate required for cooling 1 kW (approximately 0.024 l/min) at the time the plasma is turned ON (steps S42 and S44). In this way, the heat input from plasma may be consumed upon evaporating the water, and the temperature of the mounting table 12 may be prevented from increasing.

Also, the controller 68 implements at least one of the above control methods of (1) rotor 73a rotation speed control, (2) valve 76 position control, and (3) airflow adjustment valve 77 position control to adjust the pressure within the evaporation chamber 71a and thereby control the temperature of the heat exchanger 71 to a desired temperature (step S46). In this way, while plasma is turned ON, the controller 68 feedback controls the pressure within the evaporation chamber 71a so that the temperature of the heat exchanger 71 may be controlled to the desired temperature. In the example illustrated in FIG. 5, the controller 68 reduces the pressure P within the evaporation chamber 71a from pressure P0 (0.1 MPa) to pressure PA (0.001 MPa) to control and maintain the temperature of the heat exchanger 71 at the desired temperature of 25° C.

Then, the controller 68 determines whether the plasma has been turned OFF (step S48). The controller 68 repeats the processes of steps S44, S46, and S48 until the plasma is turned OFF. The controller 68 may determine that the plasma has been turned OFF when the supply of gas to the processing chamber 10 and the application of the high frequency power to the mounting table 12 are terminated, for example. Alternatively, the controller 68 may monitor the temperature of the mounting table 12 using the temperature sensor and determine whether the plasma has been turned OFF based on the detected temperature change of the mounting table 12, for example. Upon determining that the plasma has been turned OFF, the controller 68 stops the operation of the rotary pump 73 and terminates the circulation of water (step S50). Then, the controller 68 increases the pressure within the evaporation chamber 71a to a pressure level that would not enable water to evaporate within the evaporation chamber 71a (step S52). In this way, evaporation of water may be promptly disabled, and as a result, the cooling operation may be promptly terminated as soon as the plasma is turned OFF.

For example, in FIG. 5, when the plasma is turned OFF at time t2, the controller 68 controls the water flow rate Mb to be 0 and controls the pressure P within the evaporation chamber 71a to an ordinary pressure PB (0.1 MPa). In this way, the cooling operation for cooling the electrostatic chuck 40 may be promptly terminated, and the temperature of the mounting table 12 may be prevented from decreasing.

Also, as illustrated in FIG. 5, in a case where a process is started at time t3 and the heat input from plasma in this process is only half the heat input from plasma during the process performed from time t1 to time t2, the controller 68 circulates water at a flow rate Mc that is lower than the flow rate Ma of the previous process and adjusts the pressure P within the evaporation chamber 71a to a pressure PC that is higher than the pressure PA of the previous process. In this way, the controller 68 controls the flow rate of water and the pressure within the evaporation chamber 71a according to the heat input to thereby adjust the temperature of the electrostatic chuck 40 and control the temperature of the wafer W to a desired temperature.

Note that if the temperature T of the mounting table 12 is desirably increased, the pressure P within the evaporation chamber 71a may be increased. On the other hand, if the temperature T of the mounting table 12 is desirably decreased, the pressure P within the evaporation chamber 71a may be decreased. For example, in the case where the temperature T of the mounting table 12 is desirably increased, the controller 68 may control the pressure P within the evaporation chamber 71a to pressure PA', which is higher than pressure PA, so that the temperature T of the mounting table 12 may be raised to temperature T'. However, normally, the temperature T of the mounting table 12 is preferably not changed during a process. Thus, the controller 68 controls the pressure P within the evaporation chamber 71a to pressure PA, which is lower than pressure PA'.

Note that a heater (not shown) is embedded within the mounting table 12. The temperature control apparatus 70 of the present embodiment is configured to cool the electrostatic chuck 40, and the heater is configured to heat the electrostatic chuck 40. The controller 68 controls the cooling operation of the temperature control apparatus 70 and the heating operation of the heater to thereby adjust the temperature of the wafer W placed on the mounting table 12.

As described above, by using the temperature control apparatus 70 of the present embodiment, the cooling capacity may be changed by controlling the flow rate of water. Also, the temperature at which the water is to be vaporized may be changed by controlling the pressure within the evaporation chamber 71a. Note that there may be cases in which the heat exchanger 71 is required to vaporize water at a temperature that is lower than room temperature such as 0° C. or 5° C. For example, in the case where water is desirably vaporized within the evaporation chamber 71a that is controlled to approximately 5° C., the controller 68 controls the position of the airflow adjustment valve 77 to adjust the flow rate of air and reduce the pressure within the evaporation chamber 71a to approximately several Torr. In the case where water is desirably vaporized within the evaporation chamber 71a that is controlled to approximately 50° C., the controller 68 controls the position of the airflow adjustment valve 77 so that the pressure within the evaporation chamber 71a may be higher than the pressure when the evaporation chamber 71a is controlled to 5° C.

As can be appreciated, the temperature control apparatus 70 of the present embodiment enables responsive and accurate temperature control while addressing issues of global warming by refraining from using ozone depleting substances in the refrigerant.

(Temperature Control Example)

In the following, an exemplary temperature control method using the temperature control apparatus 70 of the present embodiment is described with reference to the flowchart of FIG. 6. In the present temperature control example, the flow rate of water is controlled to be at its maximum so that the cooling capacity of the temperature control apparatus 70 may be maximized and a refrigeration cycle with a high cooling capacity may be achieved.

When the temperature control process of the present example is started, the controller 68 determines whether plasma has been turned ON (step S62). Upon determining that the plasma has been turned ON, the controller 68 starts the operation of the rotary pump 73 and circulates water at a predetermined flow rate according to the heat input from plasma (step S64), and controls the valve 76 to be in a fully open position (step S66).

By controlling the valve 76 to be in the fully open position and thereby maximizing the conductance of the suction pipe 72, the rotary pump 73 may be used at its maximum potential. In this way, the water circulated within the refrigeration cycle may always be circulated at a flow rate that can achieve the desired cooling capacity.

On the other hand, in the present temperature control example, the controller 68 controls the flow rate of air introduced into the evaporation chamber 71a upon adjusting the pressure within the evaporation chamber 71a such that the temperature of the evaporation chamber 71a may be controlled to the desired temperature. That is, in the present temperature control example, the airflow adjustment valve 77 is used instead of the valve 76 to adjust the pressure within the evaporation chamber 71a. Thus, the controller 68 feedback controls the position of the airflow adjustment valve 77 so that the pressure within the evaporation chamber 71a comes closer to a predetermined pressure level for achieving the desired temperature within the evaporation chamber 71a (step S68). In this way, the pressure within the evaporation chamber 71a may always be controlled to be close to a target value, and the temperature within the evaporation chamber 71a may be accurately controlled.

Then, the controller 68 determines whether the plasma has been turned OFF (step S70). The controller 68 repeats the processes of steps S64, S66, S68, and S70 until the plasma is turned OFF. Upon determining that the plasma has been turned OFF, the controller 68 terminates the operation of the rotary pump 73 and the circulation of water (step S72), and controls the valve 76 to be in a completely closed position (step S74).

As described above, in the present temperature control example, the valve 76 arranged between the heat exchanger 71 and the rotary pump 73 is controlled to be completely closed as soon as the plasma is turned OFF. In this way, the evaporation chamber 71a may be sealed and prevented from communicating with the vacuum space (reduced-pressure space) of the rotary pump 73. Because the evaporation chamber 71a always communicates with the atmosphere, the pressure within the evaporation chamber 71a promptly increases to atmospheric pressure once the valve 76 is completely closed. As a result, evaporation of water is terminated and the cooling operation is promptly stopped.

By implementing the temperature control method of the present temperature control example in the plasma processing apparatus 1 using the temperature control apparatus 70 of the present embodiment, ON/OFF operations of a dynamic cooling operation may be controlled using the valve 76 arranged between the heat exchanger 71 and the rotary pump 73. That is, the cooling operation may be promptly started by fully opening the valve 76 as soon as application of a high frequency power from the high frequency power supply 32 corresponding to the heat input source is started, and the cooling operation may be terminated by completely closing the valve 76 as soon as the heat input from the heat input source ceases. In this way, temperature responsiveness may be further improved, for example. Also, by controlling the valve 76 in the manner described above, the cooling capacity of the rotary pump 73 may be maximized.

Second Embodiment

Figure 7:
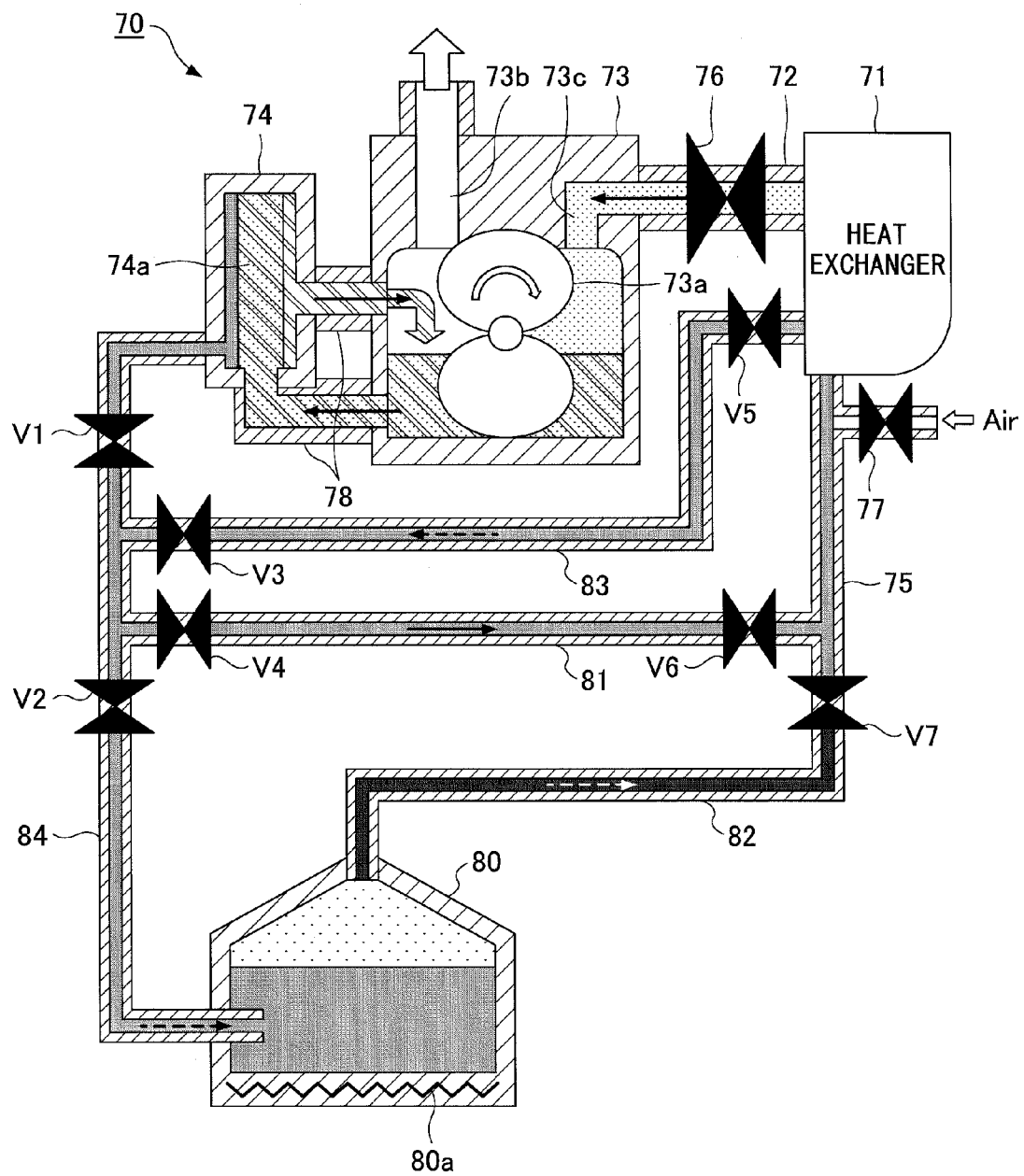
FIG. 7 illustrates an overall configuration of a temperature control apparatus according to a second embodiment of the present invention.

In the following, a second embodiment of the present invention is described with reference to FIG. 7. The temperature control apparatus 70 according to the second embodiment includes a heating cycle in addition to the refrigeration cycle as described above. In the temperature control apparatus 70 according to the second embodiment, the refrigeration cycle and the heating cycle may be interchangeably operated by using switch valves.

The refrigeration cycle is configured by a tubular path including the heat exchanger 71, the suction pipe 72, the rotary pump 73, the oil water separator 74, a water pipe 81, and the water pipe 75.

The heating cycle is configured by a tubular path including the heat exchanger 71, a water pipe 83, a water pipe 84, a boiler 80, a water pipe 82, and the water pipe 75.

As can be appreciated, the temperature control apparatus 70 according to the present embodiment includes a circulation path for the refrigeration cycle that is configured to have the water separated from oil by the oil water separator 74 circulated back to the heat exchanger 71 via the water pipe 81, and a circulation path for the heating cycle that is configured to have the water introduced into the boiler 80 via the water pipe 84. Also, the temperature control apparatus 70 according to the present embodiment has switch valves V1-V7 arranged at the water pipes 75, 81, 82, 83, and 84.

In the case of using the heating cycle, the heat exchanger 71 has to prompt heat exchange that involves condensation of heated vapor and the transfer of latent heat given up by the vapor. Accordingly, in the present embodiment, the boiler 80 is added to generate the heated vapor. The boiler 80 may use heat from a built-in heater 80a to heat water and generate heated vapor, for example. As with the cooling capacity of the refrigeration cycle, data relating to the amount of heat (kW) that may be output when a given amount of vapor (kg) is converted back to water is stored in the storage unit of the controller 68, and the controller 68 controls the amount of heated vapor to be generated at the boiler 80 based on such data. The heating capacity of the heating cycle may be determined by the amount of heated vapor generated.

In the present embodiment, the controller 68 performs feedback control operations based on the detection result of the temperature sensor so that the current temperature may be close to the target temperature. The feedback control operations may be performed using both the refrigeration cycle and the heating cycle by switching between the refrigeration cycle and the heating cycle. In this way, accurate temperature control may be enabled using a single temperature control apparatus 70.

Figure 8:
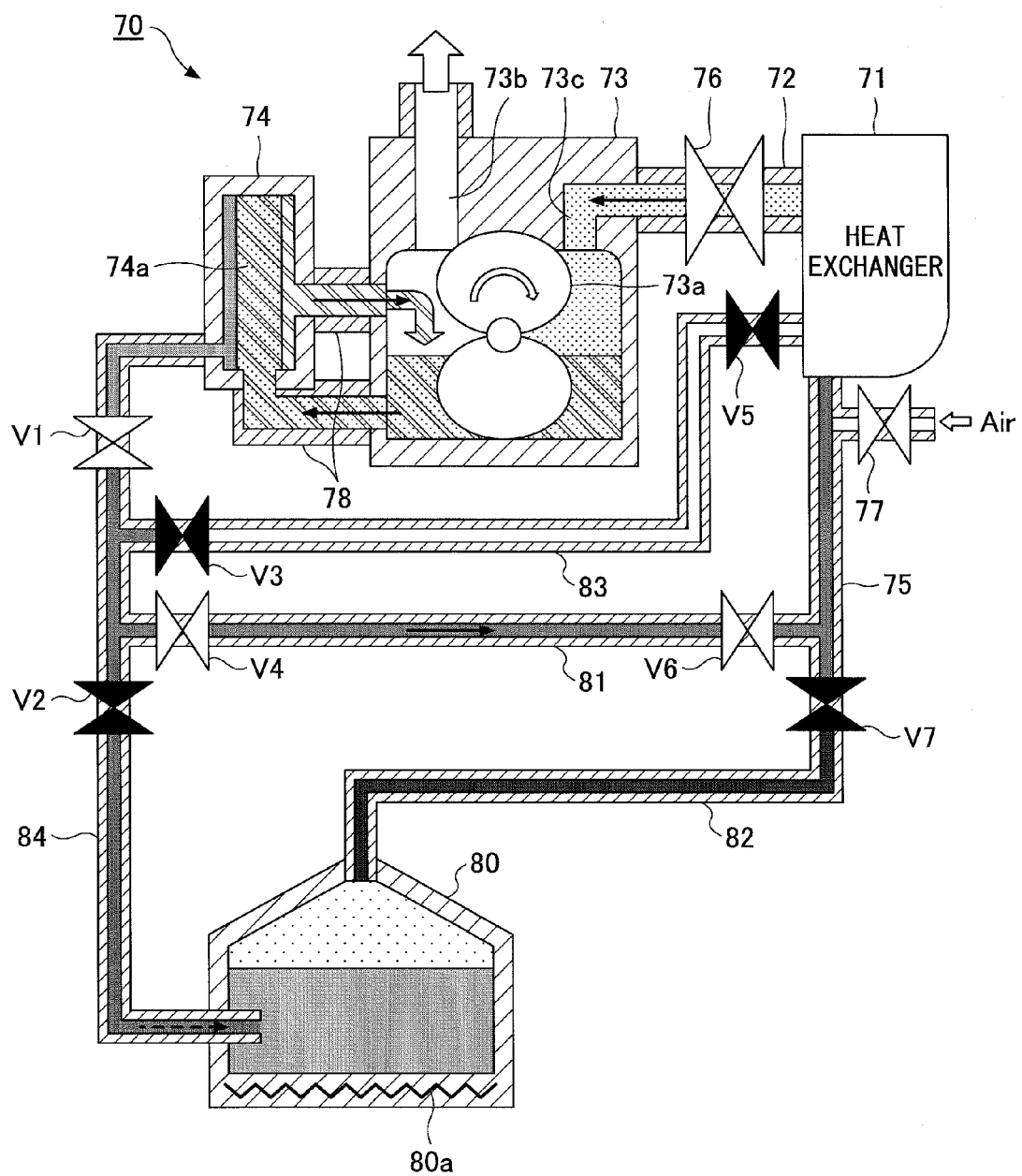
FIG. 8 illustrates an operating state of the temperature control apparatus according to the second embodiment during operation of a refrigeration cycle.

For example, in a case where the temperature of the mounting table 12 is desirably controlled to 25° C., first, the controller 68 operates the refrigeration cycle according to the heat input from plasma. FIG. 8 illustrates an operating state of the temperature control apparatus 70 during operation of the refrigeration cycle. When the refrigeration cycle is operated, the switch valves V1, V4, and V6 arranged at the circulation path of the refrigeration cycle are open, and the switch valves V2, V3, V5, and V7 arranged at the circulation path of the heating cycle are closed. Also, the positions of the valve 76 and the airflow adjustment valve 77 maybe adjusted by the controller 68.

Figure 9:
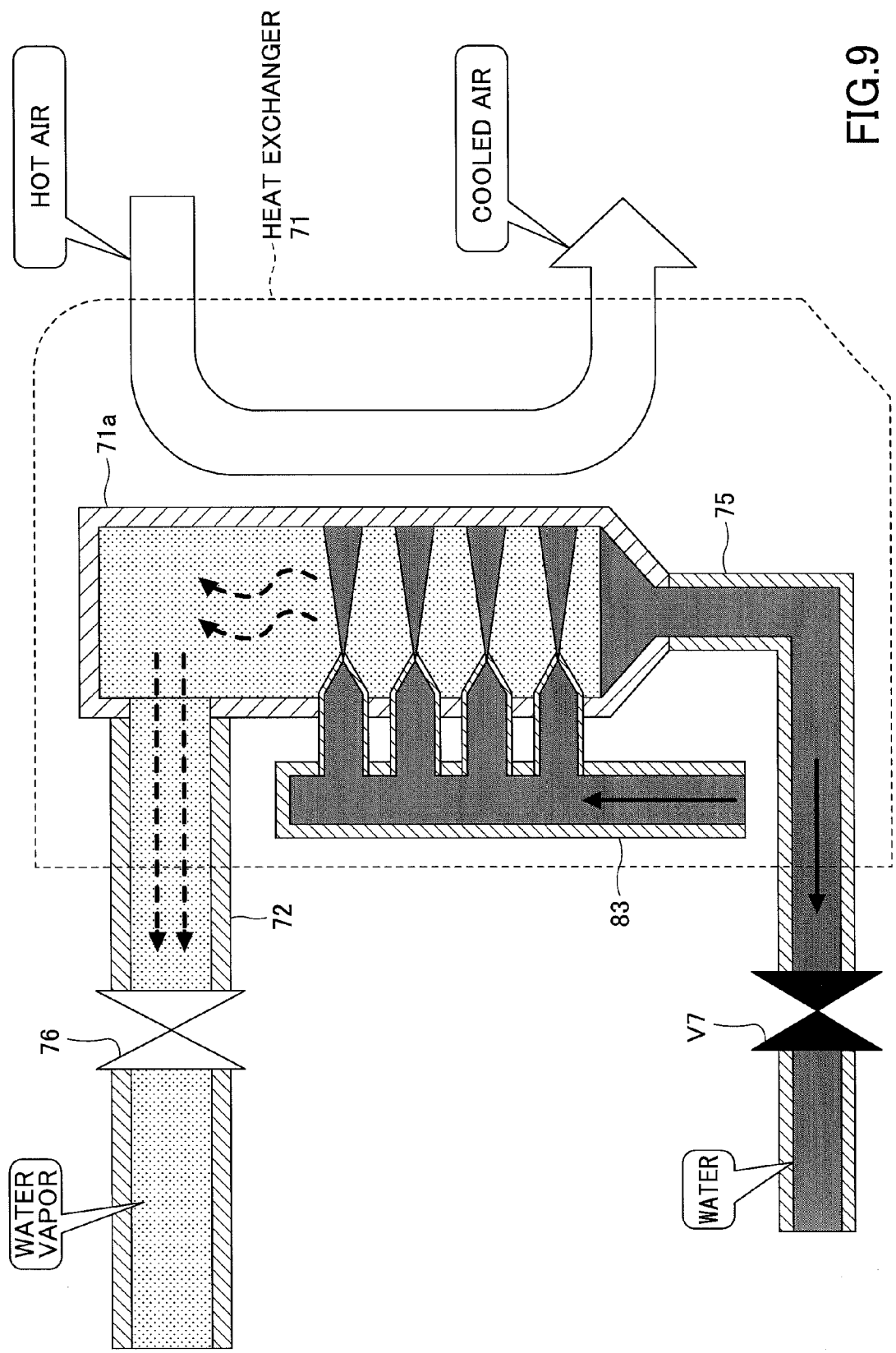
FIG. 9 illustrates an operating state of the heat exchanger during operation of the refrigeration cycle of the temperature control apparatus according to the second embodiment.

In this case, the water output from the oil water separator 74 passes through the water pipe 81 to circulate through the heat exchanger 71 where the water is converted into water vapor. The water vapor then flows into the rotary pump 73 to be dissolved into the oil within the rotary pump 73. The mixture of oil and water is then transported to the oil water separator 74 where the oil and water are separated from each other once again. While the water is circulated in this manner, vaporization heat is removed from the surroundings of the heat exchanger 71 when water is turned into water vapor at the heat exchanger 71, and as a result, the surrounding air is cooled as illustrated in FIG. 9. In this way, a cooling effect is achieved.

Figure 10:
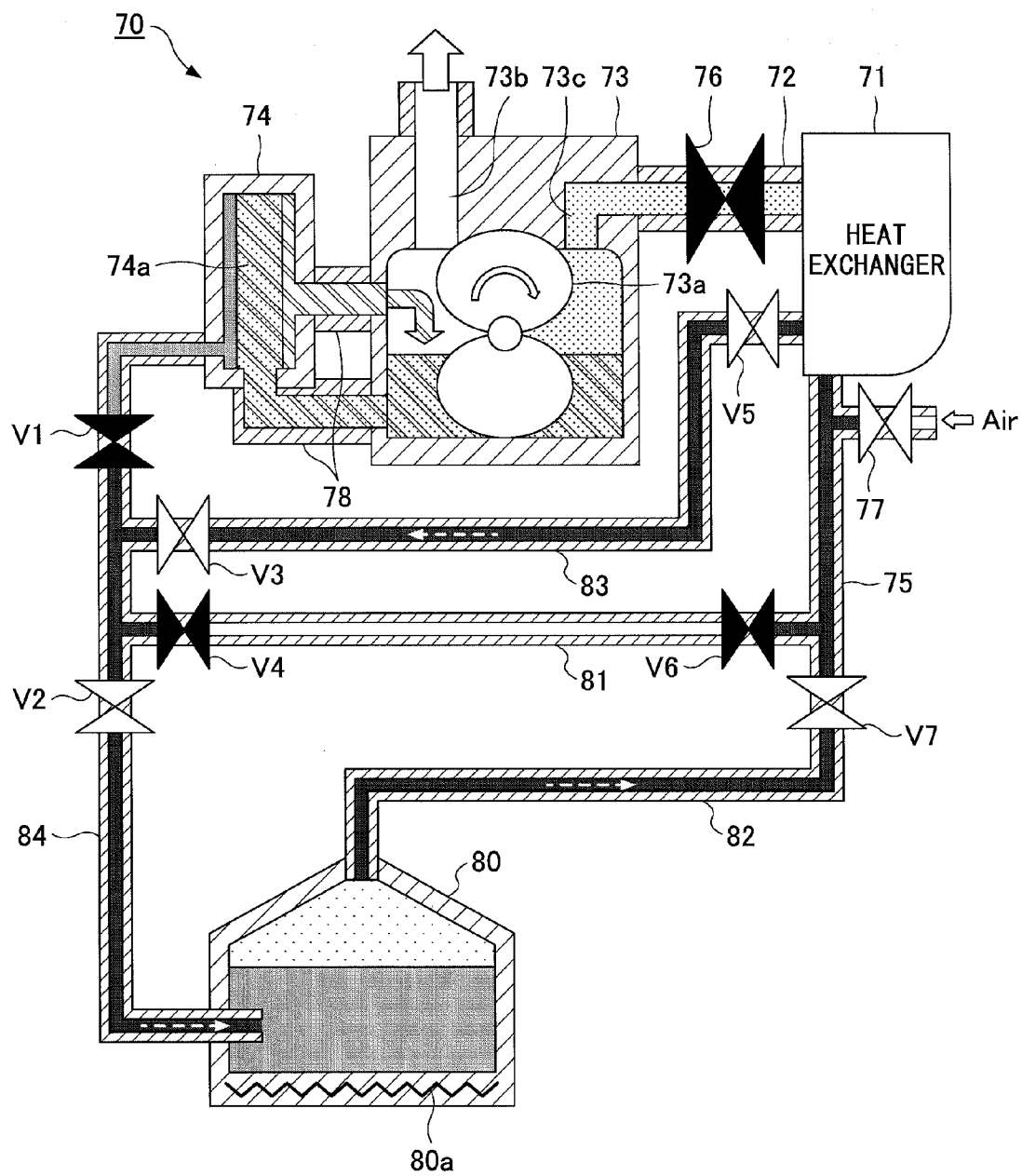
FIG. 10 illustrates an operating state of the temperature control apparatus according to the second embodiment during operation of a heating cycle.

On the other hand, in a case where the temperature of the mounting table 12 decreases to a value less than 25° C., the controller 68 operates the heating cycle and performs feedback control operations to adjust the temperature of the mounting table to 25° C. FIG. 10 illustrates an operating state of the temperature control apparatus 70 during operation of the heating cycle. When the heating, cycle is operated, the switch valves V2, V3, V5, and V7 arranged at the circulation path of the heating cycle are open, and the switch valves V1, V4, and V6 arranged at the circulation path of the refrigeration cycle are closed. Also, the valve 76 is closed in this case but the position of the airflow adjustment valve 77 may be adjusted by the controller 68.

Figure 11:
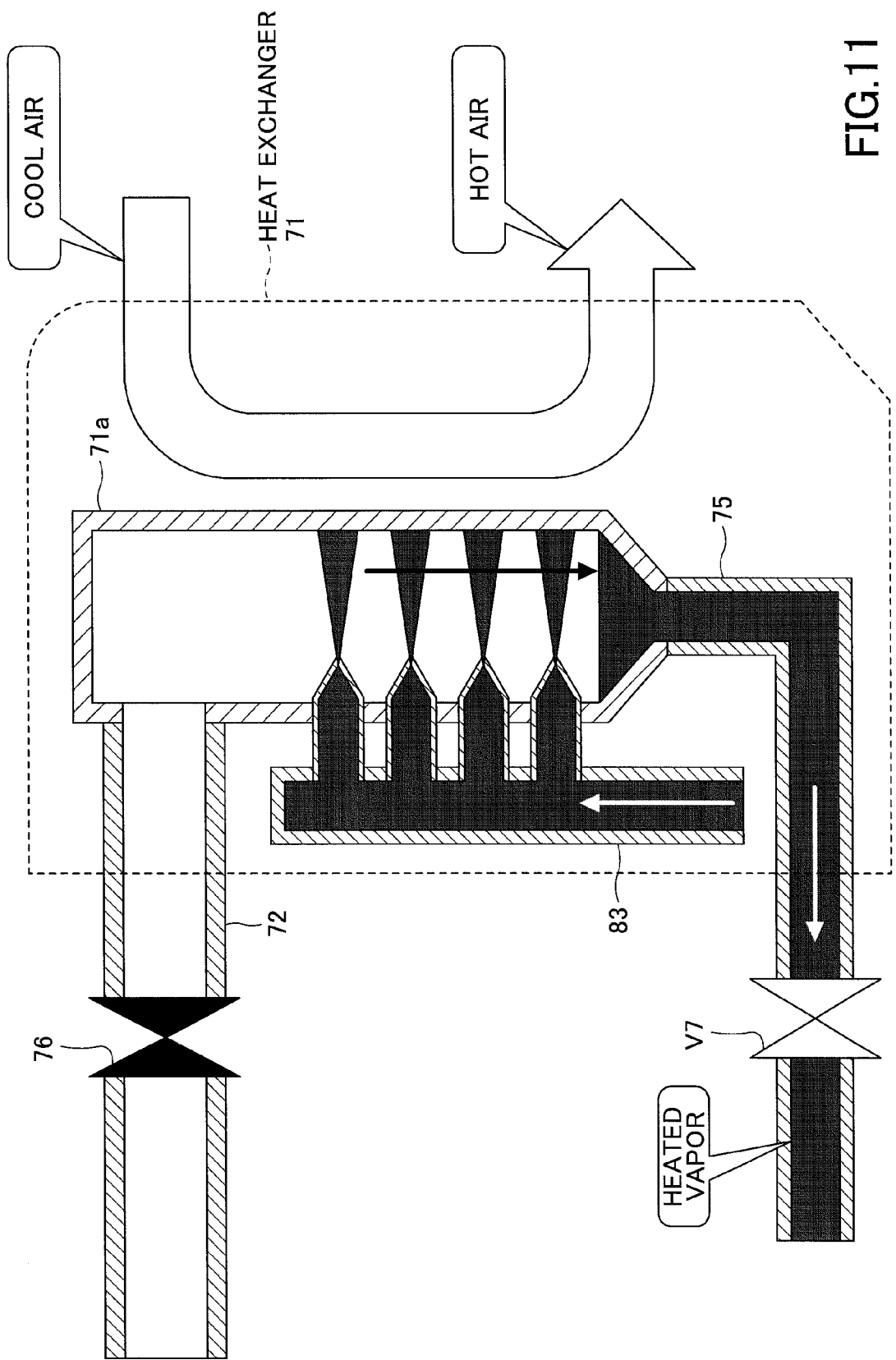
FIG. 11 illustrates the heat exchanger during operation of the heating cycle of the temperature control apparatus according to the second embodiment.

In this case, water output from the oil water separator 74 passes through the water pipe 84 and enters the boiler 80. The water is heated by the heater 80a at the boiler 80 and heated vapor is generated as a result. The generated heated vapor passes through the water pipes 82 and 75 and circulates through the heat exchanger 71 where the heated vapor is converted back to water. The water within the heat exchanger 71 then enters the water pipe 83 and is transported back to the boiler 80 via the water pipe 84. While the water is circulated in this manner, as illustrated in FIG. 11, condensation heat is given up and transferred to the surroundings of the heat exchanger 71 when the water vapor is turned into water at the heat exchanger 71, and as a result, the surrounding air is heated. In this way, a heating effect is achieved.

Figure 12:
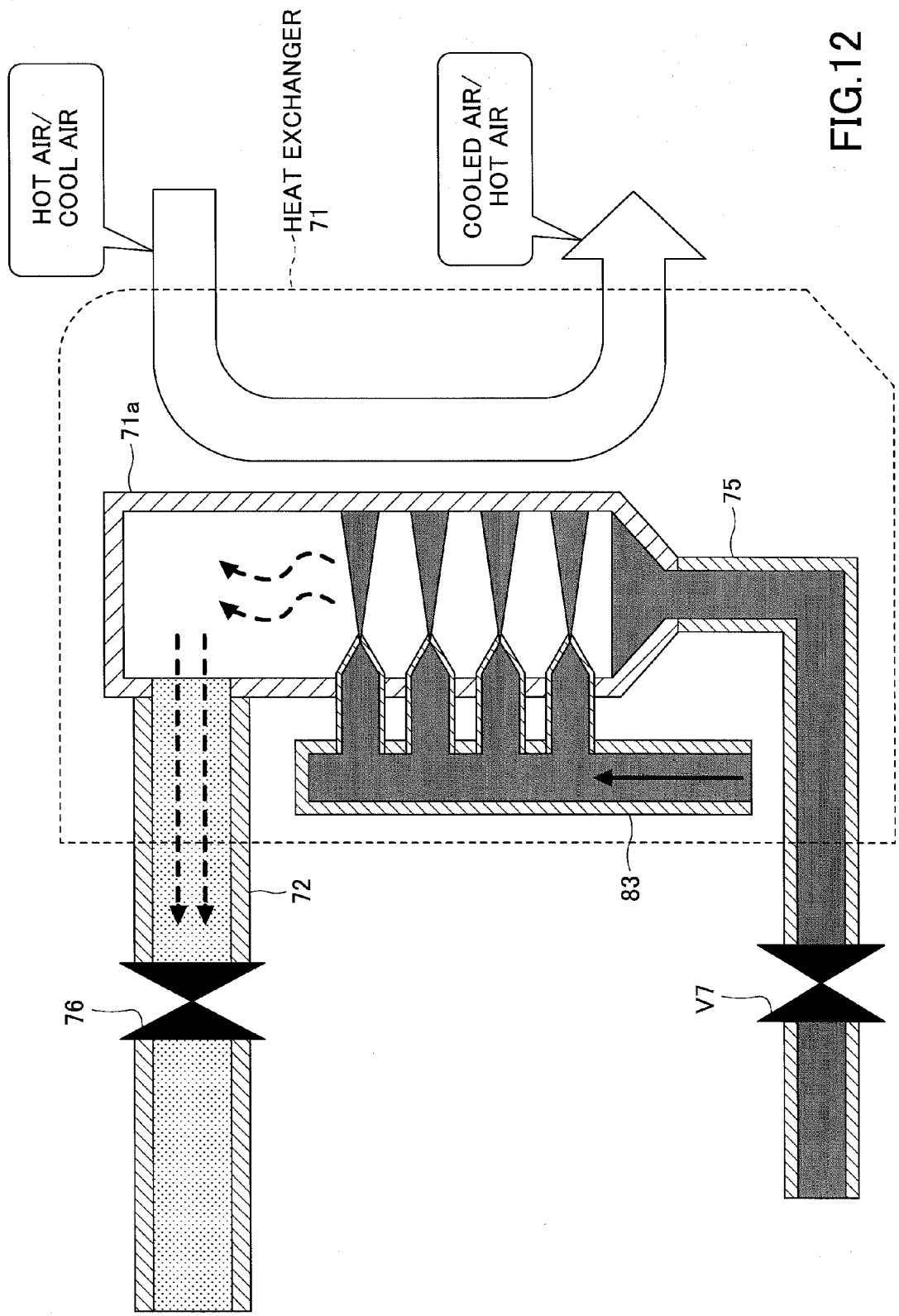
FIG. 12 illustrates the heat exchanger during operation of the heating/refrigeration cycle of the temperature control apparatus according to the second embodiment.

In the temperature control apparatus 70 according to the present embodiment, when the temperature of the mounting table 12 is raised too high by the heating cycle, the controller 68 switches the positions of the switch valves V1-V7 to operate the refrigeration cycle. On the other hand, when the temperature of the mounting table 12 becomes too low, the controller 68 switches the positions of the switch valves V1-V7 to operate the heating cycle and performs feedback control operations so that the temperature of the mounting table 12 may be controlled to the desired temperature of 25° C., for example. By repeating the operations as described above, hot air may be cooled during operation of the refrigeration cycle, and cool air may be heated during operation of the heating cycle as illustrated in FIG. 12. In this way, accurate temperature control may be performed using a single temperature control apparatus 70.

Note that during operation of the heating cycle, the interior of the evaporation chamber 71a is under increased pressure. For example, during operation of the heating cycle, the evaporation chamber 71a may be under a pressure of 0.2 MPa. On the other hand, during operation of the refrigeration cycle, the interior of the evaporation chamber 71a may be under a reduced pressure of 0.001 MPa, for example. Also, in the present embodiment, the pressure within the evaporation chamber 71a may be controlled to an increased-pressure or a reduced-pressure by adjusting at least one of the rotation speed of the rotor 73a, the position of the valve 76, and the position of the airflow adjustment valve 77.

According to an aspect of the present invention, the temperature control apparatus 70 according to the embodiments described above may perform temperature control without using an ozone depleting substance in the refrigerant. That is, the temperature control apparatus 70 according to embodiments of the present invention may be effectively used as a countermeasure against global warming. According to another aspect of the present invention, a refrigeration cycle and a heating cycle may be implemented within a closed circuit so that the temperature control apparatus 70 may be used in accordance with a current usage environment. In this way, system development costs may be reduced and introduction of the system may be facilitated, for example.

Also, in the temperature control apparatus 70 according to embodiments of the present invention, the pressure within the heat exchanger 71 does not have to be controlled to a high pressure. In fact, the pressure within the heat exchanger 71 is controlled to a reduced-pressure in order to enable vaporization of a liquid under a temperature of less than 100° C. Accordingly, in a case where the temperature control apparatus 70 is installed in a plasma processing apparatus, a predetermined portion of the temperature control apparatus 70 may be easily controlled to a reduced pressure in view of the fact that controlling the interior of a chamber to a reduced-pressure atmosphere is normally performed at the plasma processing apparatus. Also, a chamber with a relatively small heat capacity may be used in the heat exchanger 71 so that temperature responsiveness may be improved and energy resources may be conserved, for example.

<Concluding Remarks>

Although the present invention has been described above with respect to certain illustrative embodiments, the present invention is not limited to these embodiments. That is, numerous variations and modifications will readily occur to those skilled in the art, and the present invention includes all such variations and modifications that may be made without departing from the scope of the present invention. Also, embodiments and modifications of the present invention may be combined to the extent practicable.

For example, according to an aspect of the present invention, a plasma processing apparatus may be provided that includes a processing chamber in which a plasma process is performed; a gas supply source configured to supply gas to the processing chamber; a plasma source configured to supply power for plasma generation and generate plasma from gas within the processing chamber; a heat exchanger that is arranged in at least one of the processing chamber, a mounting table arranged in the processing chamber, an upper electrode arranged in the processing chamber, and a deposition shield arranged in the processing chamber, and is configured to exchange heat using a phase change of a refrigerant; a rotary pump configured to receive the refrigerant from the heat exchanger and fuse the refrigerant with oil contained inside the rotary pump; and an oil refrigerant separator configured to receive the refrigerant fused with the oil from the rotary pump and separate the refrigerant from the oil. The plasma processing apparatus further includes a refrigeration cycle that implements a cooling function by circulating the refrigerant separated from the oil back to the heat exchanger.

According to another aspect of the present invention, a temperature control apparatus according to an embodiment of the present invention is not limited to controlling the temperature of the electrostatic chuck 40 of a plasma processing apparatus. For example, a temperature control apparatus according to an embodiment of the present invention may be configured to control at least one of the electrostatic chuck 40, the upper electrode (shower head 38), a deposit shield, and the processing chamber 10 of a plasma processing apparatus and may have the heat exchanger 71 arranged near at least one of the mounting table 12, the upper electrode, the deposition shield, and the processing chamber 10.

According to another aspect of the present invention, a temperature control apparatus according to an embodiment of the present invention is not limited to being arranged near one or more of the above members of the plasma processing apparatus to cool or heat the above members. For example, a temperature control apparatus according to an embodiment of the present invention may be used to control the temperature of a chiller unit arranged at the plasma processing apparatus.

According to another aspect of the present invention, a processing apparatus that uses a temperature control apparatus according to an embodiment of the present invention is not limited to a plasma processing apparatus. For example, a temperature control apparatus according to an embodiment of the present invention may be installed and used in a processing chamber of a refrigerator to prevent the temperature within the refrigerator from increasing as a result of a heat input from a heat input source. Also, a temperature control apparatus according to an embodiment of the present invention may be installed and used in a processing chamber of an air conditioner. Moreover, a temperature control apparatus according to an embodiment of the present invention may be installed in any type of processing chamber to achieve cooling or heating within the processing chamber.

Figure 6:
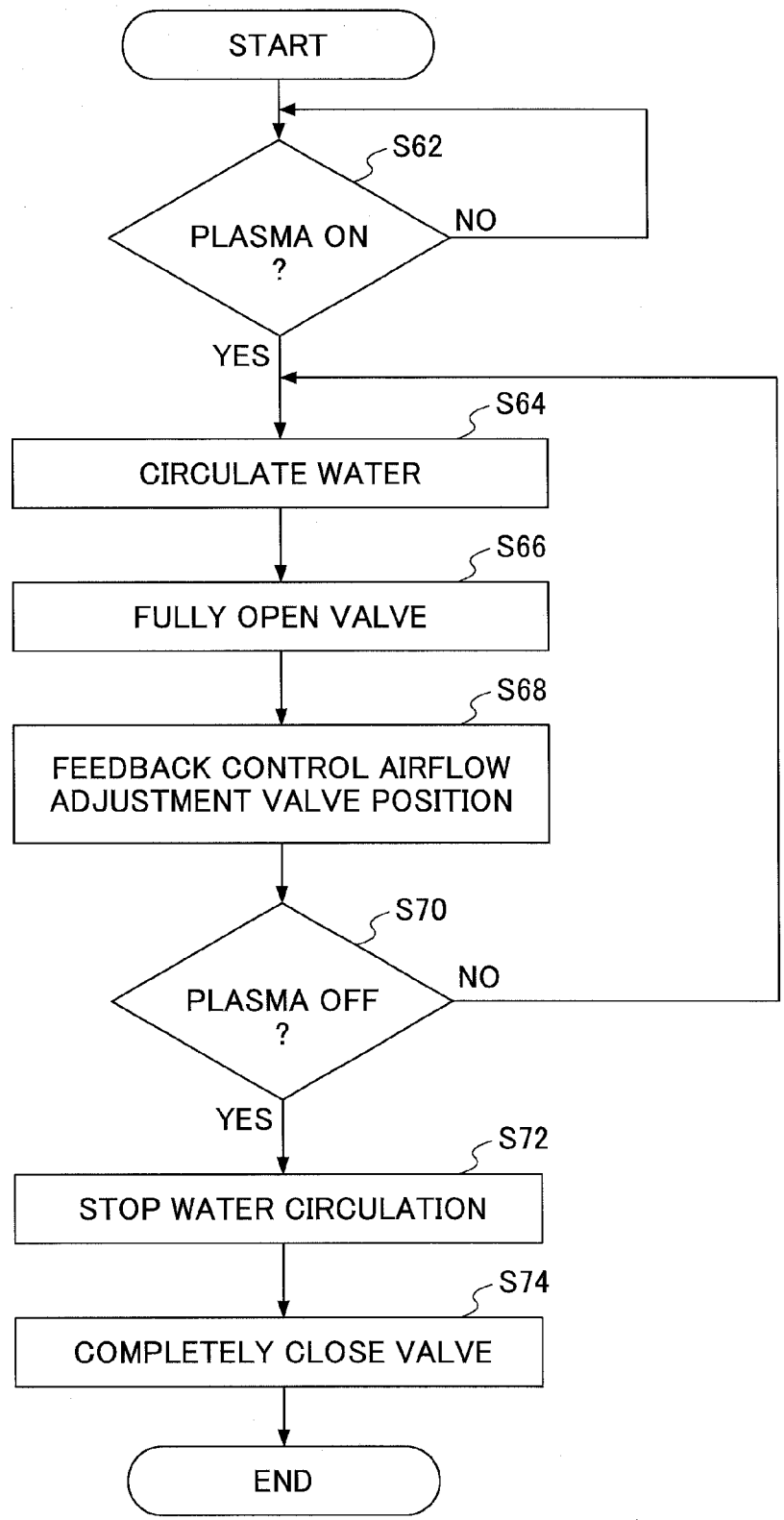
FIG. 6 is a flowchart illustrating operations of the temperature control apparatus according to the first embodiment.

Regardless of the type of processing apparatus, the temperature control apparatus installed therein may be configured to perform temperature control as illustrated in FIG. 4 as well as temperature control as illustrated in FIG. 6. That is, the valve 76 arranged at the suction pipe 72 may be controlled to fully open in conjunction with the start of operation of a heat input source, and the valve 76 may be controlled to completely close in conjunction with the termination of the operation of the heat input source. In this way, the temperature may be dynamically controlled, for example.

Also, note that in the case where the temperature control apparatus according to an embodiment of the present invention is installed in a plasma processing apparatus, the type of plasma processing apparatus is not limited to a parallel-plate type etching apparatus but may also be applied to a cylindrical RLSA (radical line slot antenna) plasma processing apparatus, an ICP (inductively coupled plasma) plasma processing apparatus, a microwave plasma processing apparatus, or some other type of plasma processing apparatus. Also, the type of process performed in the plasma processing apparatus is not limited to etching, but may include other processes such as film formation, ashing, and sputtering, for example.

The present application is based on and claims the benefit of priority of Japanese Patent Application No. 2011-249081 filed on Nov. 14, 2011, and U.S. Provisional Application No. 61/568,181 filed on Dec. 8, 2011, the entire contents of which are herein incorporated by reference.

DESCRIPTION OF THE REFERENCE NUMERALS 1 plasma processing apparatus
10 processing chamber
12 mounting table (lower electrode)
32 high frequency power supply
38 shower head (upper electrode)
40 electrostatic chuck
62 gas supply source
68 controller
70 temperature control apparatus
71 heat exchanger
72 suction pipe
71a evaporation chamber
73 rotary pump
73a rotor
74 oil water separator
75 water pipe
76 valve
77 airflow adjustment valve
80 boiler
V1-V7 switch valve

The invention claimed is:

1. A temperature control apparatus comprising:
   a heat exchanger configured to exchange heat using a phase change of a refrigerant;
   a rotary pump configured to receive the refrigerant from the heat exchanger and fuse the refrigerant with oil contained inside the rotary pump;
   an oil refrigerant separator configured to receive the refrigerant fused with the oil from the rotary pump and separate the refrigerant from the oil; and
   a refrigeration cycle that implements a cooling function by circulating the refrigerant separated from the oil back to the heat exchanger,
   wherein
   the refrigerant separated from the oil by the oil refrigerant separator circulates through the heat exchanger, the rotary pump, and the oil refrigerant separator; and
   the oil separated from the refrigerant by the oil refrigerant separator is recovered by the rotary pump.

2. The temperature control apparatus as claimed in claim 1, wherein
   the rotary pump reduces a pressure within an evaporation chamber arranged in the heat exchanger by rotating a rotor of the rotary pump; and
   the heat exchanger performs cooling by absorbing vaporization heat upon vaporizing the refrigerant within the evaporation chamber under the reduced pressure.

3. The temperature control apparatus as claimed in claim 1, further comprising:
   a boiler configured to heat the refrigerant; and
   a heating cycle that implements a heating function by circulating the heated refrigerant through the heat exchanger and the boiler;
   wherein the heat exchanger receives the heated refrigerant from the boiler and performs heating by releasing condensation heat upon liquefying the heated refrigerant within the evaporation chamber.

4. The temperature control apparatus as claimed in claim 3, further comprising:
   a switch valve for switching between the refrigeration cycle and the heating cycle.

5. The temperature control apparatus as claimed in claim 4, wherein the refrigerant separated by the oil refrigerant separator corresponds to water that is circulated through the refrigeration cycle or the heating cycle in response to a switching of the switch valve.

6. The temperature control apparatus as claimed in claim 1, wherein the heat exchanger is arranged in at least one of a processing chamber of a plasma processing apparatus in which a plasma process is performed, a mounting table arranged in the plasma processing apparatus, an upper electrode arranged in the plasma processing apparatus, and a deposition shield arranged in the plasma processing apparatus.

7. A processing apparatus comprising:
   a temperature control apparatus that is mounted to a temperature control object and is configured to control a temperature of the temperature control object, the temperature control apparatus including
   a heat exchanger configured to exchange heat using a phase change of a refrigerant;
   a rotary pump configured to receive the refrigerant from the heat exchanger and fuse the refrigerant with oil contained inside the rotary pump;
   an oil refrigerant separator configured to receive the refrigerant fused with the oil from the rotary pump and separate the refrigerant from the oil; and
   a refrigeration cycle that implements a cooling function by circulating the refrigerant separated from the oil back to the heat exchanger,
   wherein
   the refrigerant separated from the oil by the oil refrigerant separator circulates through the heat exchanger, the rotary pump, and the oil refrigerant separator; and
   the oil separated from the refrigerant by the oil refrigerant separator is recovered by the rotary pump.

* * * * *